United States Patent
Hsieh et al.

(10) Patent No.: US 12,243,898 B2
(45) Date of Patent: Mar. 4, 2025

(54) IMAGE SENSOR WITH HIGH QUANTUM EFFICIENCY

(71) Applicant: Taiwan Semiconductor Manufacturing Co., Ltd., Hsinchu (TW)

(72) Inventors: Feng-Chien Hsieh, Pingtung (TW); Hsin-Chi Chen, Tainan (TW); Kuo-Cheng Lee, Tainan (TW); Yun-Wei Cheng, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 315 days.

(21) Appl. No.: 17/207,378

(22) Filed: Mar. 19, 2021

(65) Prior Publication Data
US 2022/0302186 A1 Sep. 22, 2022

(51) Int. Cl.
*H01L 27/146* (2006.01)

(52) U.S. Cl.
CPC .... *H01L 27/1464* (2013.01); *H01L 27/14636* (2013.01); *H01L 27/14685* (2013.01)

(58) Field of Classification Search
CPC .......... H01L 27/1464; H01L 27/14685; H01L 27/14605; H01L 27/1461
See application file for complete search history.

(56) References Cited

U.S. PATENT DOCUMENTS

| | | | |
|---|---|---|---|
| 10,811,453 B1 * | 10/2020 | Mun | H01L 27/1464 |
| 2013/0241018 A1 | 9/2013 | JangJian et al. | |
| 2013/0270667 A1 | 10/2013 | Wang et al. | |
| 2015/0372033 A1 * | 12/2015 | Cheng | H01L 27/14645 257/435 |
| 2017/0025460 A1 | 1/2017 | Chen et al. | |
| 2020/0027909 A1 * | 1/2020 | Ebiko | H01L 27/14636 |
| 2020/0075661 A1 * | 3/2020 | Cheng | H01L 27/14643 |

FOREIGN PATENT DOCUMENTS

| | | |
|---|---|---|
| CN | 103378111 A | 10/2013 |
| TW | 201937208 A | 9/2019 |

* cited by examiner

*Primary Examiner* — Mounir S Amer
*Assistant Examiner* — Alexander Belousov
(74) *Attorney, Agent, or Firm* — Sterne, Kessler, Goldstein & Fox P.L.L.C.

(57) ABSTRACT

The present disclosure describes an image sensor device and a method for forming the same. The image sensor device can include a semiconductor layer. The semiconductor layer can include a first surface and a second surface. The image sensor device can further include an interconnect structure formed over the first surface of the semiconductor layer, first and second radiation sensing regions formed in the second surface of the semiconductor layer, a metal stack formed over the second radiation sensing region, and a passivation layer formed through the metal stack and over a top surface of the first radiation sensing region. The metal stack can be between the passivation layer and an other top surface of the second radiation sensing region.

20 Claims, 14 Drawing Sheets

IMAGE SENSOR WITH HIGH QUANTUM EFFICIENCY

BACKGROUND

Semiconductor image sensors are used to sense incoming visible or non-visible radiation, such as visible light and infrared light. Complementary metal-oxide-semiconductor (CMOS) image sensors (CIS) and charge-coupled device (CCD) sensors are used in various applications, such as digital still cameras, mobile phones, tablets, and goggles. These image sensors utilize an array of pixels that absorb (e.g., sense) the incoming radiation and convert it into electrical signals. An example of an image sensor is a back side illuminated (BSI) image sensor device, which detects radiation from a "back side" of a substrate.

BRIEF DESCRIPTION OF THE DRAWINGS

Aspects of the present disclosure are best understood from the following detailed description when read with the accompanying figures.

DETAILED DESCRIPTION

Figure 1A:
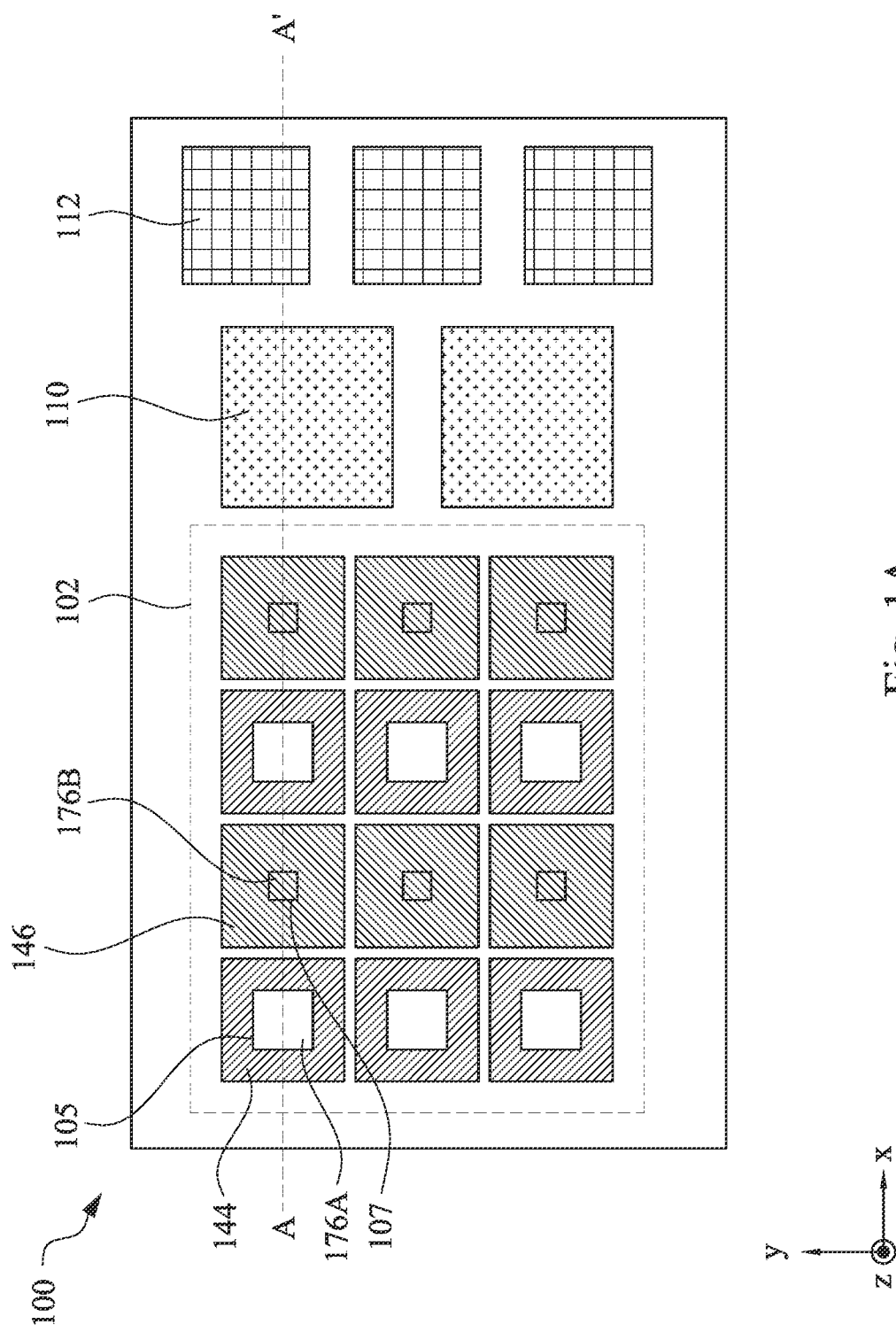
FIG. 1A is a top view of a semiconductor image sensor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

As used herein, the term "vertical" means nominally perpendicular to the surface of a substrate.

As used herein, the term "insulating layer" refers to a layer that functions as an electrical insulator (e.g., a dielectric layer).

As used herein, the term "high-k" refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

A BSI image sensor device can include a semiconductor substrate (e.g., silicon substrate) with pixels formed therein. Each pixel in the BSI image sensor device can be optimized to absorb incident light across a broad wavelength range. The BSI image sensor device may not have sufficient quantum efficiency and/or sufficient dynamic range to effectively detect a low irradiance target under a strong background irradiance, such as a traffic light in the daytime, because the background irradiance (e.g., daytime sunlight) can saturate the BSI image sensor device with a high photocurrent, while the low irradiance target (e.g., the traffic light) can only generate a relatively lower photocurrent in the BSI image sensor device nearly indistinguishable from the high photocurrent associated with the background irradiance.

To address the aforementioned challenges, this disclosure is directed to a fabrication method and an image sensor configured to detect low irradiance targets. The image sensor can include first and second groups of pixels. The first group of pixels can be configured to have a high quantum efficiency to improve signal-to-noise ratio (SNR). The second group of pixels can be configured to reduce the incident light to extend exposure time, thus improving the second group of pixels' saturation level (e.g., enhancing a detectable illumination level). Each of the first group of pixels can include a metal grid structure with an aperture and a first radiation sensing region formed under the metal grid's aperture. In some embodiments, the first radiation sensing region can include groove patterns to improve its quantum efficiency. Each of the second group of pixels can include a second radiation sensing region and a blocking metal formed above the radiation sensing region's top surface. The blocking metal can reduce the incident light intensity to the second radiation sensing region. A benefit of the present disclosure, among others, is to integrate both high quantum efficiency pixels and high saturation level pixels in the image sensor, thus improving the image sensor's quantum efficiency and dynamic range for multiple irradiance targets with wide range of illumination intensity.

Figure 1B:
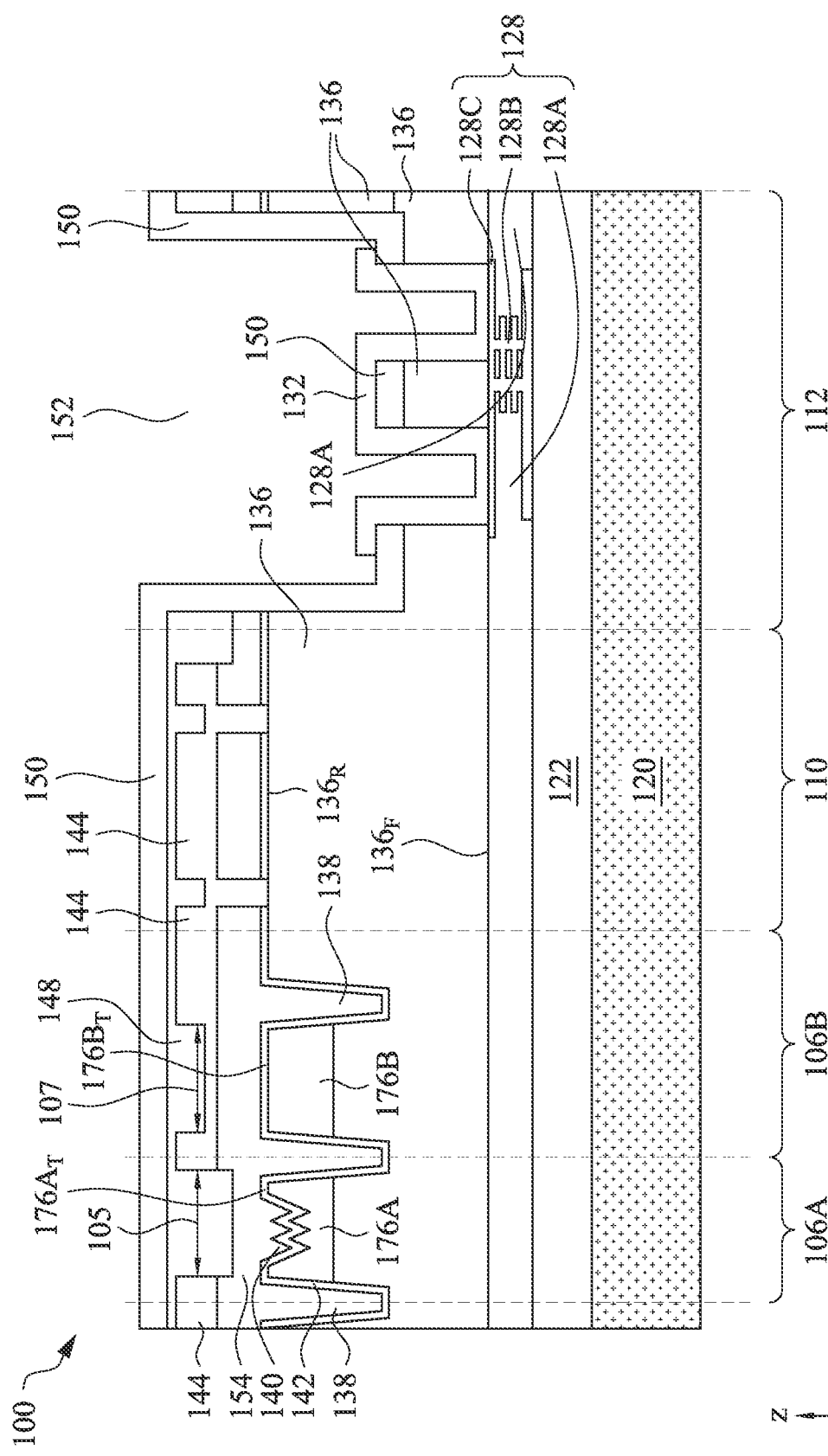
FIGS. 1B and 1C are cross-sectional views of a semiconductor image sensor device, according to some embodiments.
Figure 1C:
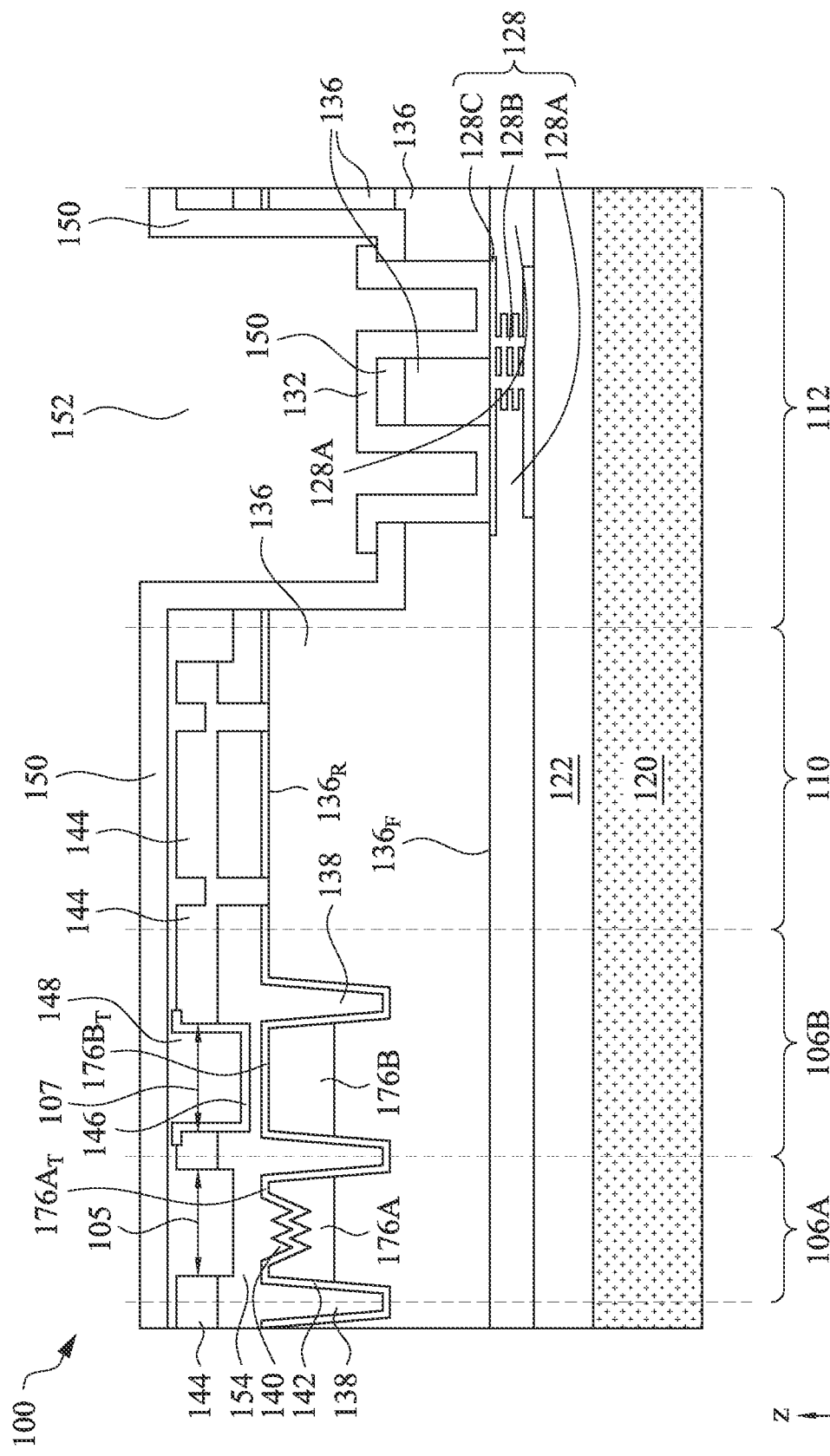

An image sensor device 100 having high quantum efficiency and high dynamic range is described with reference to FIGS. 1A-1C, according to some embodiments. FIG. 1A illustrates a top view of image sensor device 100, according to some embodiments. FIGS. 1B and 1C illustrate cross-sectional views along line A-A' of image sensor device 100, according to some embodiments. The discussion of elements in FIGS. 1A-1C with the same annotations applies to each other, unless mentioned otherwise. Image sensor device 100 can be a semiconductor image sensor device. In some embodiments, image sensor device 100 can be integrated in a microprocessor, memory device, or other integrated circuit (IC).

Referring to FIG. 1A, image sensor device 100 can include a pixel array 102 having pixels 106A and 106B. Image sensor device 100 can also include calibration pixels 110 configured to determine an intrinsic characteristic (e.g., a dark current) associated with pixel array 102. Each of pixels 106A and 106B can be configured to sense electromagnetic radiation, such as incident visible light or infrared light. Each of pixels 106A and 106B can be adjacent to one another in pixel array 102. For example, as shown in FIG. 1A, pixels 106A and 106B can be adjacent to one another with a rectangular layout arrangement in pixel array 102. Other layout arrangements for pixels 106A and 106B in pixel array 102 are within the scope and spirit of this disclosure.

In some embodiments, pixels 106A can be configured with boosted quantum efficiency to sense electromagnetic radiation. For example, each pixel 106A can include a radiation sensing region 176A and a grid structure 144 with an aperture 105 formed over radiation sensing region 176A. Incident light (e.g., electromagnetic radiation) can be absorbed by radiation sensing region 176A through aperture 105. Grid structure 144 can boost pixel 106A's quantum efficiency by reflecting incident light through aperture 105 towards the underlying radiation sensing region 176A. In some embodiments, pixel 106A's grid structure 144 can be connected to another adjacent pixel 106A's grid structure 144. As shown in FIG. 1A, aperture 105 can be a rectangular ring formed over and surrounding radiation sensing region 176A. In some embodiments, aperture 105 can be a hexagonal ring formed over and surrounding radiation sensing region 176A. Other shapes for aperture 105 are within the scope and spirit of this disclosure.

In some embodiments, pixels 106B can be configured with boosted saturation level to sense a low irradiance target under a high background irradiance (e.g., a traffic light under the daytime sunlight). For example, each pixel 106B can include a radiation sensing region 176B, grid structure 144 with an aperture 107 formed over radiation sensing region 176B, and a blocking layer 146 formed over aperture 107. Incident light can be absorbed by radiation sensing region 176B through aperture 107, where blocking layer 146 can overlap aperture 107 to reduce an amount of the incident light absorbed by the underlying radiation sensing region 176B. This can reduce a total amount of photo-generated carriers in pixel 106B, thus improving the saturation level of pixel 106B. In some embodiments, pixel 106B's blocking layer 146 can be formed over pixel 106B's grid structure 144 and aperture 107. As shown in FIG. 1A, pixel 106B's blocking layer 146 can be separated from an adjacent pixel 106A's grid structure 144. In some embodiments, pixel 106B's blocking layer 146 can be connected to an adjacent pixel 106A's grid structure 144 and/or an adjacent pixel 106B's grid structure 144.

Referring to FIG. 1B, image sensor device 100 can include a semiconductor layer 136 that accommodates each of radiation sensing regions 176A and 176B. Semiconductor layer 136 can include a front surface $136_F$ and a back surface $136_R$. In some embodiments, each of radiation sensing regions 176A and 176B can be formed proximate to semiconductor layer 136's back surface $136_R$, where semiconductor layer 136's back surface $136_R$ can include radiation sensing region 176A's top surface $176A_T$ and radiation sensing region 176B's top surface $176B_T$. In some embodiments, each of radiation sensing regions 176A and 176B can be formed proximate to semiconductor layer 136's back surface $136_R$, while an IC layer can be formed proximate to semiconductor layer 136's front surface $136_F$. The IC layer can include transistor structures, capacitor structures, resistor structures, inductor structures, isolation structures, metal wire structures, or any other suitable structures. In some embodiments, the IC layer can be a stack of chips, such as memory chips, central processing unit (CPU) chips, other functional chips (e.g., radio frequency (RF) chips), and combinations thereof. The IC layer is not show in FIG. 1B for simplicity.

Semiconductor layer 136 can include a semiconductor material such as silicon, germanium, a compound semiconductor, an alloy semiconductor, and combinations thereof. In some embodiments, semiconductor layer 136 can be an epitaxial material strained for performance enhancement. In some embodiments, semiconductor layer 136 can include one or more p-type doped regions and/or n-type doped regions. Semiconductor layer 136 can have a thickness greater than 1 μm. In some embodiments, semiconductor layer 136 can have a thickness from about 3 μm to about 10 μm. The thickness of semiconductor layer 136 can be determined by a variety of factors, such as a desired optical sensitivity and the manufacturing costs of image sensor device 100. Based on the disclosure herein, other materials and thicknesses for semiconductor layer 136 are within the scope and spirit of this disclosure.

In some embodiments, each of radiation sensing regions 176A and 176B can be formed proximate to semiconductor layer 136's back surface $136_R$, where image sensor device 100 can further include an anti-reflecting coating layer 142 formed over semiconductor layer 136's back surface $136_R$ to reduce an incident light reflection at back surface $136_R$. In some embodiments, anti-reflecting coating layer 142 can include silicon oxide, silicon nitride, aluminum oxide, tantalum oxide, hafnium oxide, zirconium oxide, or any other suitable dielectric material.

Image sensor device 100 can further include an interconnect structure 128 formed over semiconductor layer 136's front surface $136_F$. Interconnect structure 128 can be a back end of the line (BEOL) wiring network for image sensor device 100. Interconnect structure 128 can include a dielectric layer 128A formed over semiconductor layer 136's front surface 136$_F$. Interconnect structure 128 can further include vertical conductive structures 128B and horizontal conductive structure 128C connecting to vertical conductive structures 128B. Vertical conductive structures 128B and horizontal conductive structure 128C can be embedded in dielectric layer 128A. Vertical conductive structures 128B and/or horizontal conductive structure 128C can connect to semiconductor layer 136 to provide interconnections (e.g., wiring) between various doped features, circuitry (e.g., the IC layer formed in semiconductor layer 136), and input/output of image sensor device 100. In some embodiments, dielectric layer 128A can include silicon oxide, silicon nitride, or any other suitable insulating materials. In some embodiments, vertical conductive structures 128B and horizontal conductive structure 128C can be formed of conductive materials, such as copper, aluminum, tungsten, doped polysilicon, and any other suitable conductive material.

Image sensor device 100 can further include a carrier substrate 120 and a buffer layer 122 sandwiched between carrier substrate 120 and semiconductor layer 136. Buffer layer 122 can include a dielectric material, such as silicon oxide, silicon nitride, and other suitable dielectric material. Buffer layer 122 can be planarized to form a smooth surface by a planarization process (e.g., a chemical mechanical polishing process). In some embodiments, buffer layer 208 provides electrical isolation between semiconductor layer 136 and carrier substrate 120. Carrier substrate 120 can provide mechanical support to image sensor device 100. In some embodiments, carrier substrate 120 can include a semiconductor material similar to semiconductor layer 136. For example, carrier substrate 120 can include a silicon material. In some embodiments, carrier substrate 120 can include a glass substrate. In some embodiments, carrier substrate 120 can be bonded onto dielectric layer 128A through buffer layer 122.

Radiation sensing regions 176A and 176B are configured to sense electromagnetic radiation, such as incident visible light. In some embodiments, each of radiation sensing regions 176A and 176B can include a photodiode structure, such as a pinned layer photodiode, a photogate, a reset transistor, a source follower transistor, a transfer transistor, any other suitable structure, and combinations thereof. For simplicity purposes, a single radiation sensing region 176A and a single radiation sensing region 176B are illustrated in FIG. 1B. Any number of radiation sensing regions 176A and any number of radiation sensing regions 176B can be implemented in semiconductor layer 136.

In some embodiments, radiation sensing region 176A can include a groove structure 140 to improve pixel 106A's quantum efficiency. As shown in FIG. 1B, groove structure 140 can have a triangular-shaped cross-sectional profile. For example, grooved structure 140 can be formed of silicon using crystal orientations, such as (100) orientation and (110) orientation. In some embodiments, groove structure 140 can have a rectangular-shaped cross-sectional profile or a semi-oval shaped cross-sectional profile. Groove structure 140 can be formed at radiation sensing region 176A's top surface 176A$_T$ to provide an additional surface area for radiation sensing region 176A to collect the incident light. As a result, pixel 106A's quantum efficiency can be improved. Further, groove structure 140 can enable multiple reflections of incident light within radiation sensing region 176A—which, in turn, increases the likelihood of incident light being absorbed by pixel 106, thus improving pixel 106A's quantum efficiency. In some embodiments, each of radiation sensing regions 176A and 176B can include groove structure 140 to respectively improve quantum efficiency of pixels 106A and 106B. In some embodiments, groove structure 140 can be formed at radiation sensing region 176A's top surface 176A$_T$, while radiation sensing region 176B's top surface 176B$_T$ can be a substantially planar surface.

Image sensor device 100 can further include a trench structure 138 embedded in semiconductor layer 136 to isolate two adjacent pixel structures. For example, trench structure 138 can be formed laterally (e.g., in the y-direction) between two adjacent radiation sensing regions 176A and 176B to reduce crosstalk between the two adjacent pixels 106A and 106B. Further, trench structure 138 can enable multiple reflections of incident light (e.g., total internal reflection) for its proximate radiation sensing regions 176A and/or 176B—which, in turn, increases the likelihood of incident light being absorbed by its proximate pixels 106A and/or 106B, thus improving quantum efficiency of its proximate pixels 106A and/or 106B.

Image sensor device 100 can further include a dielectric layer 154 that fills trench structure 138. In some embodiments, dielectric layer 154 can be further formed over semiconductor layer 136's back surface 136$_R$. Dielectric layer 154 can include any suitable dielectric material that can isolate pixel 106A, pixel 106B, and calibration pixel 110 from one another. In some embodiments, dielectric layer 154 can include silicon oxide, silicon nitride, an epoxy-based polymer, or a resin material. In some embodiments, to provide the total internal reflection in the proximate radiation sensing regions 176A and/or 176B, dielectric layer 154 can include any suitable dielectric material that has a lower refractive index than semiconductor layer 136's refractive index.

Image sensor device 100 can further include grid structure 144 formed over dielectric layer 154 to reduce crosstalk between adjacent pixels of image sensor device 100 (e.g., between adjacent pixels 106A and 106B). Grid structure 144 can further reflect the incident light towards its underlying pixels 106A and/or 106B. For example, grid structure 144 can include aperture 105 formed over radiation sensing region 176A's top surface 176A$_T$. Accordingly, grid structure 144 can reflect the incident light through aperture 105 towards pixel 106A. Similarly, grid structure 144 can further include aperture 107 formed over radiation sensing region 176B's top surface 176B$_T$. Therefore, grid structure 144 can reflect the incident light through aperture 107 towards pixel 106B. In some embodiments, grid structure 144 can cover a substantially entire portion of calibration pixel 110 to block the incident light from entering calibration pixel 110. Grid structure 144 can be formed by any material that has a high reflective property. For example, grid structure 144 can be a metal grid formed by a metallic material, such as copper, tungsten, aluminum, gold, silver, iron, rhodium, beryllium, chromium, molybdenum, nickel, platinum, other suitable metal, and combinations thereof. In some embodiments, grid structure 144 can have a stacked structure, in which additional dielectric grid structures (not shown in FIG. 1B) can be formed on grid structure 144.

In some embodiments, aperture 105 can be laterally positioned in the perimeter of radiation sensing region 176A's top surface 176A$_T$. In some embodiments, an area of aperture 105 can be substantially equal to that of top surface 176A$_T$ for pixel 106A to effectively collect the incident light. For example, a ratio of aperture 105's area to top surface 176A$_T$'s area can be from about 10% to about 100%, from about 20% to about 100%, from about 50% to about 100%, or from about 75% to about 100% for pixel 106A to effectively collect the incident light. In some embodiments, aperture 107 can be laterally positioned in the perimeter of radiation sensing region 176B's top surface 176B$_T$. In some embodiments, an area of aperture 107 can be substantially approximate to that of top surface 176B$_T$ for pixel 106B to effectively collect the incident light. For example, a ratio of aperture 107's area to top surface 176B$_T$'s area can be from about 25% to about 99%, from about 40% to about 95%, from about 50% to about 95%, or from about 60% to about 95% for pixel 106B to effectively collect the incident light. Based on the disclosure herein, other dimensions for apertures 105 and 107 are within the scope and spirit of this disclosure.

In some embodiments, grid structure 144's aperture 105 can be an opening formed through grid structure 144 and positioned vertically (e.g., in the z-direction) above radiation sensing region 176A's top surface 176A$_T$, and grid structure 144's aperture 107 can be a groove structure with a bottom surface formed vertically above radiation sensing region 176B's top surface 176B$_T$. For example, as shown in FIG. 1B, aperture 105 can expose portions of dielectric layer 154 that are vertically (e.g., in the z-direction) above radiation sensing region 176A's top surface 176A$_T$. Aperture 105 can therefore prevent grid structure 144 from attenuating the incident light received by radiation sensing region 176A. In some embodiments, aperture 105 can be positioned vertically (e.g., in the z-direction) above and laterally (e.g., in the x-y plane) within the perimeter of radiation sensing region 176A's top surface 176A$_T$. Aperture 107 can be referred to as groove structure 107 that partially protrudes into grid structure 144. In some embodiments, groove structure 107 can have a bottom surface made of thinned grid structure 144. The bottom surface of groove structure 107 can cover portions of dielectric layer 154 that are vertically (e.g., in the z-direction) above radiation sensing region 176B's top surface 176B$_T$. Groove structure 107 can therefore attenuate the incident light received by radiation sensing region 176B, thus improving the saturation level of pixel 106B. In some embodiments, groove structure 107 can be positioned vertically (e.g., in the z-direction) above and horizontally (e.g., in the x-y plane) within the perimeter of radiation sensing region 176B's top surface 176B$_T$. In some embodiments, groove structure 107 can have a rectangular-shaped cross-sectional profile, a triangular-shaped cross-sectional profile, or a semi-oval shaped cross-sectional profile.

Referring to FIG. 1C, in some embodiments, apertures 105 and 107 can both be openings formed through grid structure 144, and image sensor device 100 can further include blocking layer 146 filled in aperture 107. Blocking layer 146 can be made of suitable material that can attenuate the incident light. In some embodiments, blocking layer 146 can be a metal layer formed by a metallic material, such as copper, tungsten, aluminum, other suitable metal, and combinations thereof. Blocking layer 146 can cover portions of dielectric layer 154 that are vertically (e.g., in the z-direction) above radiation sensing region 176B's top surface 176B$_T$. Blocking layer 146 can therefore attenuate the incident light received by radiation sensing region 176B, thus improving the saturation level of pixel 106B. In some embodiments, blocking layer 146 can protrude in portions of dielectric layer 154 that are vertically (e.g., in the z-direction) above radiation sensing region 176B's top surface 176B$_T$. In some embodiments, blocking layer 146 can be a nonplanar layer that has a groove structure (e.g., represented by aperture 107) formed over radiation sensing region 176B's top surface 176B$_T$. In some embodiments, portions of blocking layer 146 can be formed over grid structure 144.

Referring FIGS. 1B and 1C, image sensor device 100 can further include a passivation layer 148 formed over dielectric layer 154 and grid structures 144. In some embodiments, passivation layer 148 can be a protective layer or a hard mask (HM) layer formed over pixels 106A and 106B. For example, passivation layer 148 can be formed in apertures 105 and 107 to passivate grid structure 144, dielectric layer 154, and radiation sensing regions 176A and 176B. In some embodiments, passivation layer 148 can protrude in dielectric layer 154 through aperture 105 and/or aperture 107. In some embodiments, passivation layer 148 can have a substantially planar top surface formed over aperture 105 and/or aperture 107. Passivation layer 148 can be a suitable dielectric layer, such as silicon oxide, silicon nitride, and combinations thereof. In some embodiments, passivation layer 148 can have a thickness of about 400 nm to about 600 nm. Based on the disclosure herein, other materials and thicknesses for passivation layer 148 are within the scope and spirit of this disclosure.

Image sensor device 100 can further include pad regions 112 configured to electrically couple pixel array 102 to an external circuitry (not shown in FIGS. 1A-1C). For example, image sensor 100's pixel array 102 and/or the IC layer in semiconductor layer 136 can be electrically coupled to the external circuitry through pad region 112. Pad region 112 can include an opening 152 protruding into semiconductor layer 136, a passivation layer 150 formed over passivation layer 148 and semiconductor layer 136's sidewall in opening 152, and a contact pad 132 formed through passivation layer 150 to connect interconnect structure 128. Passivation layer 150 can be any suitable dielectric layer that protects pixels 106A, pixels 106B, and calibration pixel 110 during the fabrication process of contact pad 132. In some embodiments, passivation layer 150 can be an oxide layer, such as silicon oxide with a thickness from about 100 nm to about 500 nm. In some embodiments, passivation layer 150 can includes undoped silicate glass (USG), phosphosilicate glass (PSG), borophosphosilicate glass (BPSG), polyethyloxazoline (PEOX), fluorine-doped silicate glass (FSG), a low-k dielectric material, or combinations thereof. Based on the disclosure herein, other materials and thicknesses for passivation layer 150 are within the scope and spirit of this disclosure. Contact pad 132 can include any suitable conductive material, such as a conductive liner and a metal alloy. In some embodiments, contact pad 132 can include aluminum-copper (AlCu). In some embodiments, contact pad 132 can be formed through an isolation structure (not shown in FIGS. 1B and 1C) in semiconductor layer 136 to connect interconnect structure 128, thus avoiding an electrical short between contact pad 132 and the IC layer in semiconductor layer 136.

Figure 2:
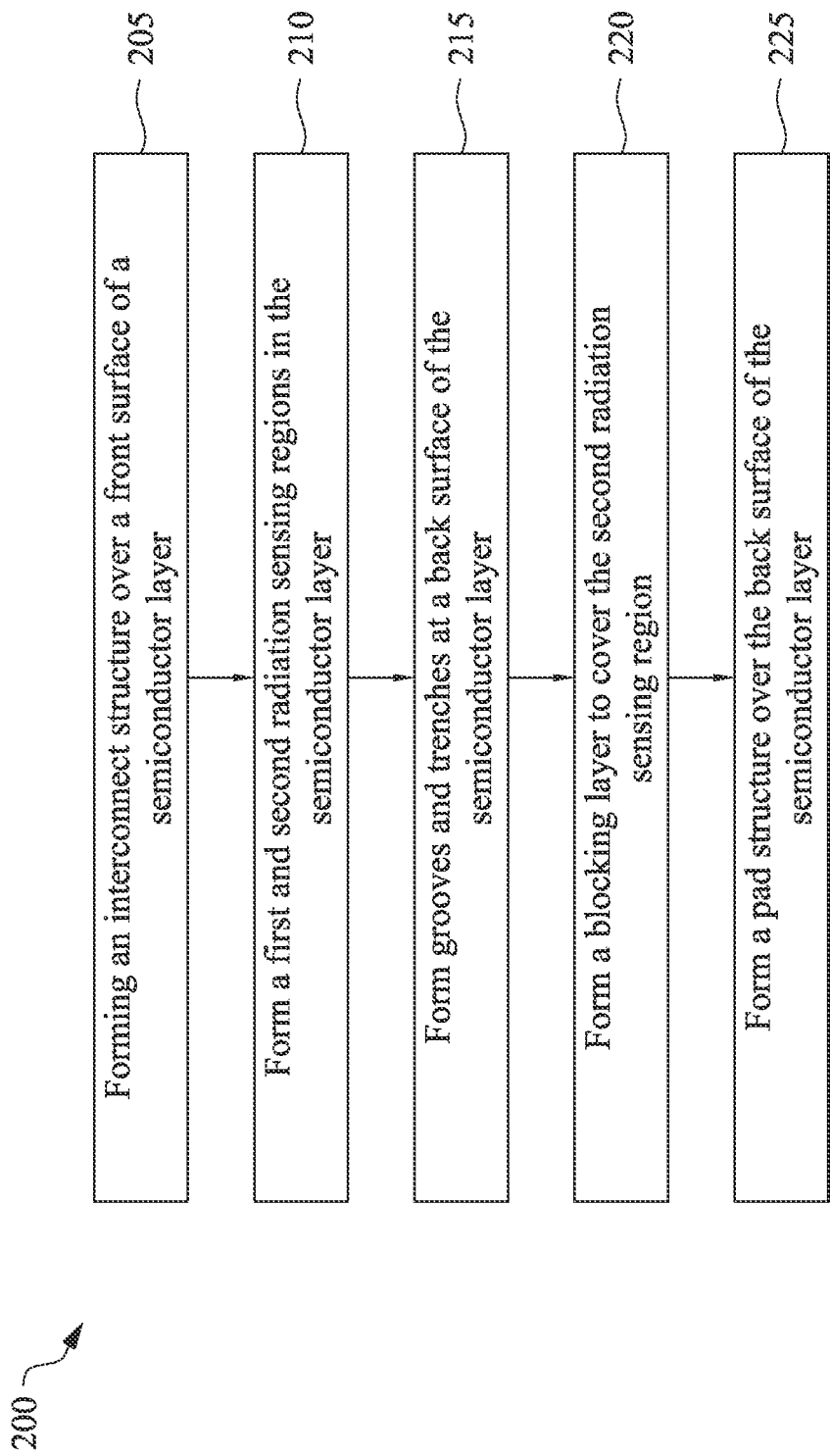
FIG. 2 is a flow diagram of a method for fabricating a semiconductor image sensor device, according to some embodiments.

FIG. 2 is a flow diagram of a method 200 for fabricating image sensor device 100, according to some embodiments. For illustrative purposes, the operations illustrated in FIG. 2 will be described with reference to the example fabrication process for fabricating semiconductor device 100 as illustrated in FIGS. 3-12, according to some embodiments. Each of FIGS. 3-12 illustrates cross-sectional views along line A-A of structure of FIG. 1A at various stages of its fabrication, according to some embodiments. Operations can be performed in a different order or not performed depending on specific applications. Method 200 may not produce a complete image sensor device 100. Accordingly, it is understood that additional processes can be provided before, during, and/or after method 200, and that some other processes may only be briefly described herein. Further, the discussion of elements in FIGS. 1A-1C and 3-12 with the same annotations applies to each other, unless mentioned otherwise.

Figure 3:
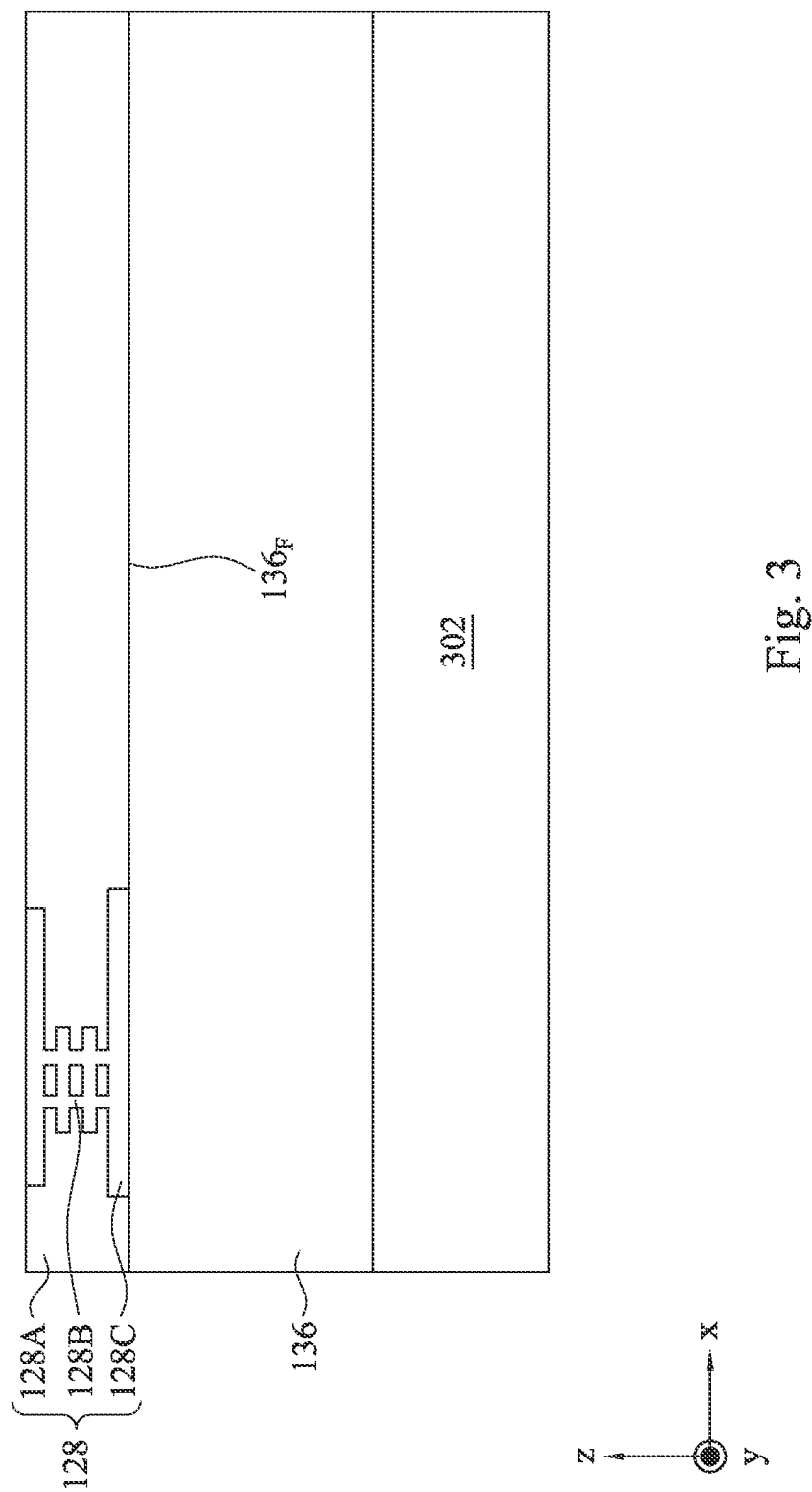
FIGS. 3-12 illustrate cross-sectional views of a semiconductor image sensor device at various stages of its fabrication process, according to some embodiments.

Referring to FIG. 2, in operation 205, an interconnect structure is formed over a front surface of a semiconductor layer. For example, as shown in FIG. 3, interconnect structure 128 can be formed over semiconductor layer 136's front surface $136_F$, as described with reference to FIG. 3. Operation 205 can begin with forming semiconductor layer 136 over a substrate 302. In some embodiments, substrate 302 can be a semiconductor substrate, such as a silicon substrate, a compound semiconductor substrate, or a silicon-on-insulator (SOI) substrate. In some embodiments, substrate 302 can be a glass substrate or a diamond substrate. The process of forming semiconductor layer 136 over substrate 302 can include performing a front-end-of-line (FEOL) fabrication process on substrate 302. In some embodiments, the process of forming semiconductor layer 136 can include performing a bonding process to attach an IC layer (e.g., memory chips, CPU chips, or RF chips) to substrate 302.

Further, in operation 205, interconnect structure 128 can be formed over semiconductor layer 136. In some embodiments, a process of forming interconnect structure 128 can include (i) blanket depositing dielectric layer 128A over semiconductor layer 136's front surface $136_F$ via a suitable deposition process, such as a chemical vapor deposition (CVD) process, a plasma-enhanced CVD (PECVD) process, a physical vapor deposition (PVD) process, and an atomic layer deposition (ALD) process, (ii) forming one or more vias in dielectric layer 128A using a lithography process and an etching process, and (iii) filling the one or more vias with one or more conductive material to form vertical conductive structures 128B using a suitable deposition process (e.g., CVD, ALD, PVD, or e-beam evaporation) and a polishing process (e.g., a chemical mechanical polishing (CMP) process). In some embodiments, the resulting trench conductor layer can be in contact with S/D contact 124. In some embodiments, the resulting vertical conductive structures 128B can connect semiconductor layer 136. The process of forming the interconnect structure 128 can further include forming horizontal conductive structure 128C using a suitable deposition process (e.g., CVD, ALD, PVD, or e-beam evaporation) and an etching process. Horizontal conductive structure 128C can connect vertical conductive structures 128B. In some embodiments, horizontal conductive structure 128C can connect semiconductor layer 136.

Figure 4:
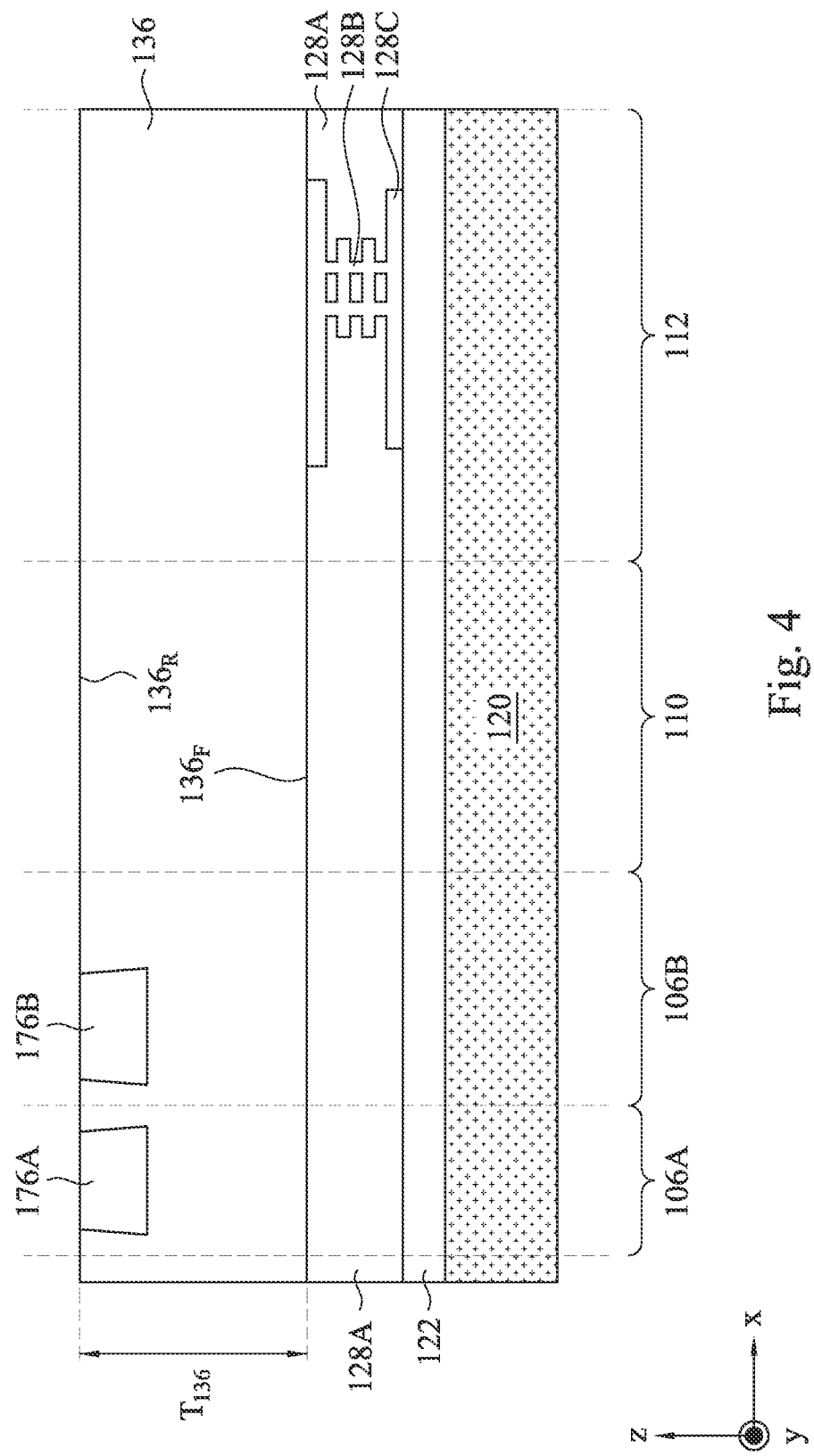

Referring to FIG. 2, in operation 210, first and second radiation sensing regions are formed in the semiconductor layer. For example, as shown in FIG. 4, radiation sensing regions 176A and 176B can be formed in semiconductor layer 136, as described with reference to FIG. 4. Operation 210 can begin with attaching the structure of FIG. 3 to carrier substrate 120. The process of attaching the structure of FIG. 3 can include (i) forming buffer layer 122 using a suitable deposition methods such as CVD, PECVD, ALD, and PVD, (ii) planarizing buffer layer 122 using a CMP process, and (iii) flipping and bonding the structure of FIG. 3 to carrier substrate 120 through buffer layer 122 with a suitable bonding process, such as fusion bonding, hybrid bonding, anodic bonding, direct bonding, cold welding, and combinations thereof.

Subsequently, in operation 210, substrate 302 can be removed and semiconductor layer 136 can be thinned to expose back surface $136_R$ using any suitable thinning process, such as a grinding process, a CMP process, a wet etching process, a dry etching process, and combinations thereof. The resulting semiconductor layer 136 can be thinned to a thickness $T_{136}$ as shown in FIG. 4. Thickness $T_{136}$ can be any suitable thickness that can accommodate radiation sensing regions 176A and 176B. In some embodiments, thickness $T_{136}$ can range from about 1 μm to about 100 μm or from about 1 μm to about 10 μm. Based on the disclosure herein, other thicknesses for thickness $T_{136}$ are within the scope and spirit of this disclosure.

Subsequently, in operation 210, radiation sensing regions 176A and 176B can be formed in semiconductor layer 136's back surface $136_R$. The process of forming radiation sensing regions 176A and 176B can include performing a doping process on semiconductor layer 136 from back surface $136_R$. In some embodiments, the doping process can include a dopant diffusion process, an ion-implantation process, an epitaxial process with in-situ doping, or a combination thereof.

Figure 5:
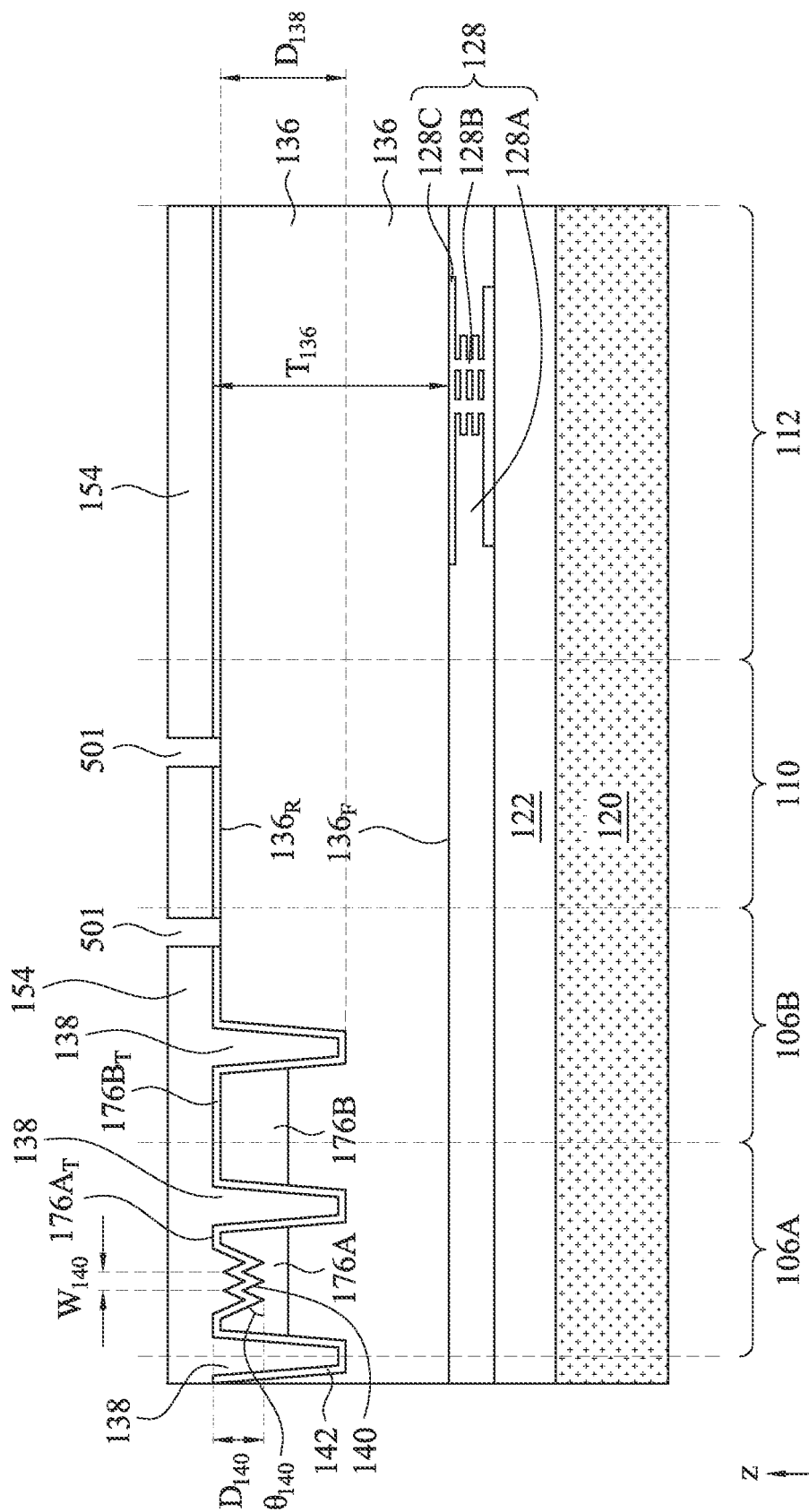

Referring to FIG. 2, in operation 215, grooves and trenches are formed at a back surface of the semiconductor layer. For example, as shown in FIG. 5, groove structures 140 and trench structures 138 can be formed at back surface $136_R$ of semiconductor layer 136. In some embodiments, groove structure 140 can be formed between two adjacent trench structures 138.

The process of forming groove structure 140 can include etching semiconductor layer 136 from back surface $136_R$ using an etching process. For example, back surface $136_R$ can include radiation sensing region 176A's top surface $176A_T$ and radiation sensing region 176B's top surface $176B_T$, where the etching process can etch from top surface $176A_T$ to form groove structure 140. In some embodiments, the etching process can selectively etch from top surface $176A_T$ to form groove structure 140, while top surface $176B_T$ can be covered by a mask layer (not shown in FIG. 5). In some embodiments, the etching process can include an anisotropic dry etching process that can from groove structure 140 with a rectangular shaped cross-sectional profile. In some embodiments, the dry etching process can be a fluorine-based etching process, a chlorine-based etching process, or combinations thereof. In some embodiments, the etching process can include the previously described dry etching process followed by a wet etching process. The wet etching process can convert groove structure 140 from the previously described rectangular-shaped cross-sectional profile to a triangular-shaped cross-sectional profile based on back surface $136_R$'s crystal orientation. In some embodiments, the wet etching process can use a fluoric acid based chemical etchant, a nitric acid based chemical etchant, or combinations thereof. Accordingly, the resulting groove structure 140 can have a depth $D_{140}$, a width $W_{140}$, and an acute angle $\theta_{140}$ with reference to groove structure 140's sidewall surface and back surface $136_R$. Depth $D_{140}$, width $W_{140}$, and angle $\theta_{140}$ can respectively have a suitable depth, width, and angle that can to improve pixel 106A's quantum efficiency. In some embodiments, depth $D_{140}$ can be from about 50 nm to about 900 nm, width $W_{140}$ can be from about 100 nm to about 1000 nm, and angle $\theta_{140}$ can be from about 50° to about 60°. Based on the disclosure herein, other depths, widths, and angles for depth $D_{140}$, width $W_{140}$, and angle $\theta_{140}$ are within the scope and spirit of this disclosure.

The process of forming trench structures 138 can include etching portions of semiconductor layer 136 from back surface $136_R$ between each of radiation sensing regions 176A and/or 176B using an etching process. In some embodiments, the resulting trench structure 138 can have a depth $D_{138}$ greater than half of semiconductor layer 136's thickness $T_{136}$. In some embodiments, trench structure 138 can have an aspect ratio (e.g., a ratio of trench structure 138's height to trench structure 138's width) greater than about 3, greater than about 5, from about 3 to about 50, or from about 5 to about 30. In some embodiments, the etching process can be a timed etching process, where the etching process continues until nominal depths of the trenches are achieved. In some embodiments, the etching process can be a dry etching process with suitable gases, such as a chlorine ($Cl_2$) gas, a tetrafluoromethane ($CF_4$) gas, an octafluorocyclobutane ($C_4F_8$) gas, and a hydrogen bromide (HBr) gas. Based on the disclosure herein, other aspect ratios for trench structure 138 are within the scope and spirit of this disclosure.

Subsequently, in operation 215, dielectric layer 154 can be formed over semiconductor layer 136's back surface $136_R$ by a deposition process followed by a planarization process (e.g., a CMP process). Dielectric layer 154 can fill trench structures 138 and groove structure 140. In some embodiments, anti-reflecting coating layer 142 can be formed between dielectric layer 154 and back surface $136_R$, such as over groove structures 140 and trench structures 138, by a deposition process. The deposition process for forming dielectric layer 154 and/or anti-reflection coating layer 142 can include any suitable deposition process, such as a CVD process, a PVD process, an ALD process, a molecular beam epitaxy (MBE) process, and a plating process. In some embodiments, after forming dielectric layer 154, openings 501 can be formed in dielectric layer 154 using an etching process. Openings 501 can be formed outside pixel array 102 (e.g., outside pixels 106A and 106B) and can mitigate a mechanical stress between dielectric layer 154 and semiconductor layer 136. In some embodiments, opening 501 can have a diameter from about 1 μm to about 10 μm to mitigate a mechanical stress between dielectric layer 154 and semiconductor layer 136. Based on the disclosure herein, other dimensions for opening 501 are within the scope and spirit of this disclosure.

Referring to FIG. 2, in operation 220, a blocking layer is formed to cover the second radiation sensing region. For example, as shown in FIG. 8, blocking layer 146 can be selectively formed over radiation sensing region 176B, as described with reference to FIGS. 6-8, according to some embodiments.

Figure 6:
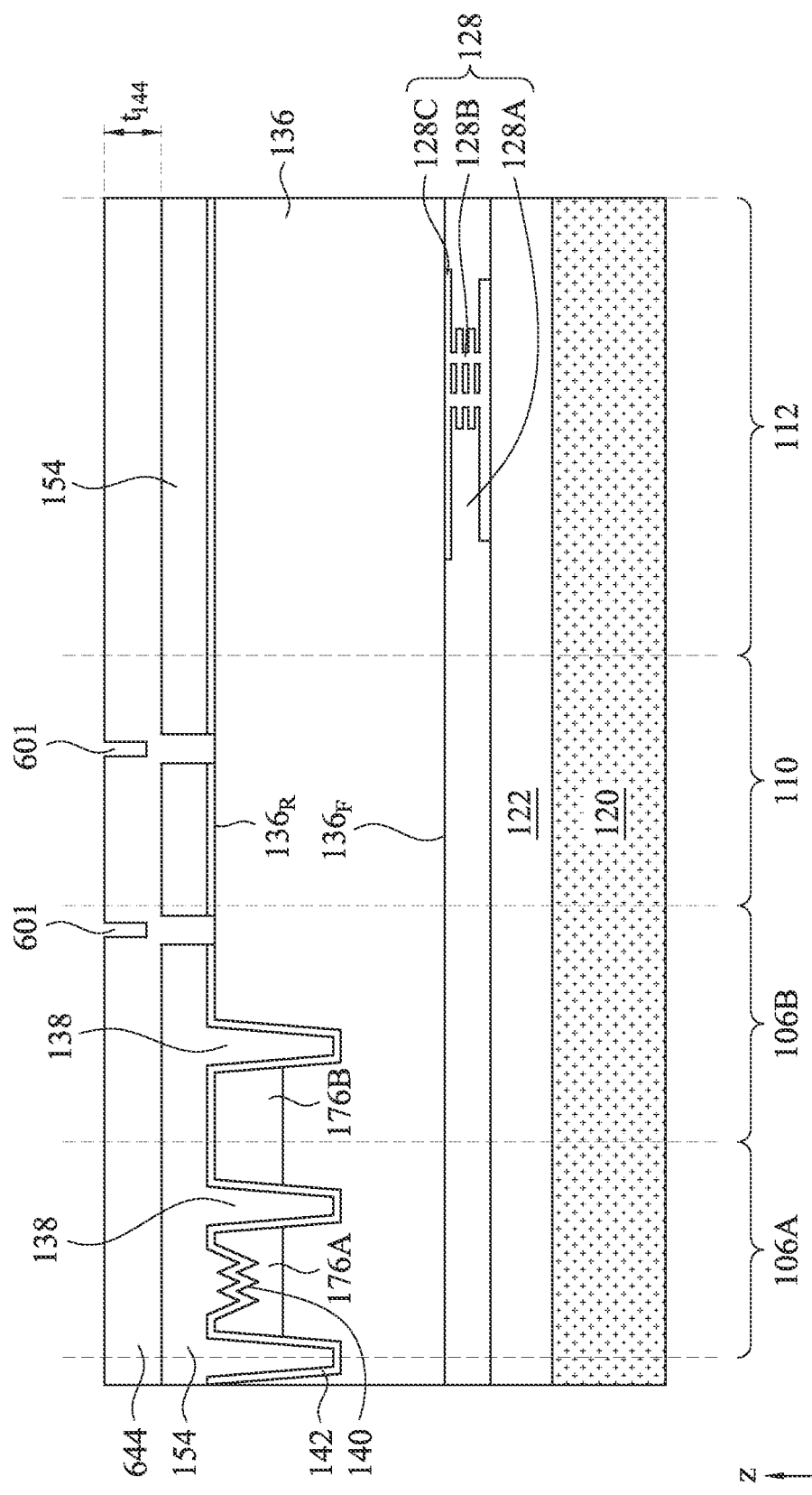

Referring to FIG. 6, operation 220 can begin with depositing a metal layer 644 with a thickness $t_{144}$ over the structure of FIG. 5 using a suitable deposition process, such as a CVD process, a PVD process, a plating process, and an e-beam evaporation process. Metal layer 644 can be a metallic material to attenuate and/or reflect incident light. In some embodiments, metal layer 644 can have a substantially planar top surface over radiation sensing regions 176A and/or 176B. In some embodiments, metal layer 644 can be conformally deposited in openings 501 of FIG. 5 to form notch structures 601 outside pixel array 102 (e.g., outside pixels 106A and 106B). In some embodiments, metal layer 644 can include copper, tungsten, aluminum, gold, silver, iron, rhodium, beryllium, chromium, molybdenum, nickel, platinum, other suitable metal, or combinations thereof. Thickness $t_{144}$ can be any suitable thickness, such as from about 200 nm to about 400 nm. Based on the disclosure herein, other materials and thicknesses for metal layer 644 are within the scope and spirit of this disclosure.

Subsequently, referring to FIG. 7, in operation 220, grid structure 144 can be formed over semiconductor layer 136's back surface $136_R$. The process of forming grid structure 144 of FIG. 7 can include forming openings 701 through metal layer 644 at pixels 106A to define apertures 105 using a lithography process and an etching process. Accordingly, opening 701 can expose its underlying dielectric layers 154 that is vertically (e.g., in the z-direction) above radiation sensing region 176A's top surface $176A_T$. In some embodiments, opening 701 can be formed laterally in a perimeter of top surface $176A_T$. In some embodiments, opening 701 can be formed having an area substantially equal to an area of top surface $176A_T$. In some embodiments, opening 701 can be formed having an area from about 10% to about 100%, from about 20% to about 100%, from about 50% to about 100%, or from about 75% to about 100% to an area of top surface $176A_T$. Similarly, the process of forming grid structure 144 can further include forming openings 703 through metal layer 644 at pixels 106B to define apertures 107 using a lithography process and an etching process. Accordingly, opening 703 can expose its underlying dielectric layers 154 that is vertically (e.g., in the z-direction) above radiation sensing region 176B's top surface $176B_T$. In some embodiments, opening 703 can be formed laterally in a perimeter of top surface $176B_T$. In some embodiments, opening 703 can be formed having an area approximate to an area of top surface $176B_T$. In some embodiments, opening 703 can be formed having an area from about 25% to about 99%, from about 40% to about 95%, from about 50% to about 95%, or from about 60% to about 95% to an area of top surface $176B_T$. Based on the disclosure herein, other dimensions for openings 701 and 703 are within the scope and spirit of this disclosure. In addition, the resulting grid structure 144 can have a horizontal (e.g., in the x-y plane) width $W_{144}$ between each of apertures 105 and/or 107. Grid structure 144's width $W_{144}$ can be any suitable width, such as from about 0.05 μm to about 5 μm. In some embodiments, grid structure 144 can have an acute angle $\theta_{144}$ ranging from about 5° to about 90°, from about 10° to about 90°, or from about 10° to about 85° at aperture 105 and/or aperture 107 with reference to dielectric layer 154's top surface to enhance the total internal reflection in the proximate radiation sensing regions 176A and/or 176B. Based on the disclosure herein, other dimensions and angles for grid structure 144 are within the scope and spirit of this disclosure.

Figure 7:
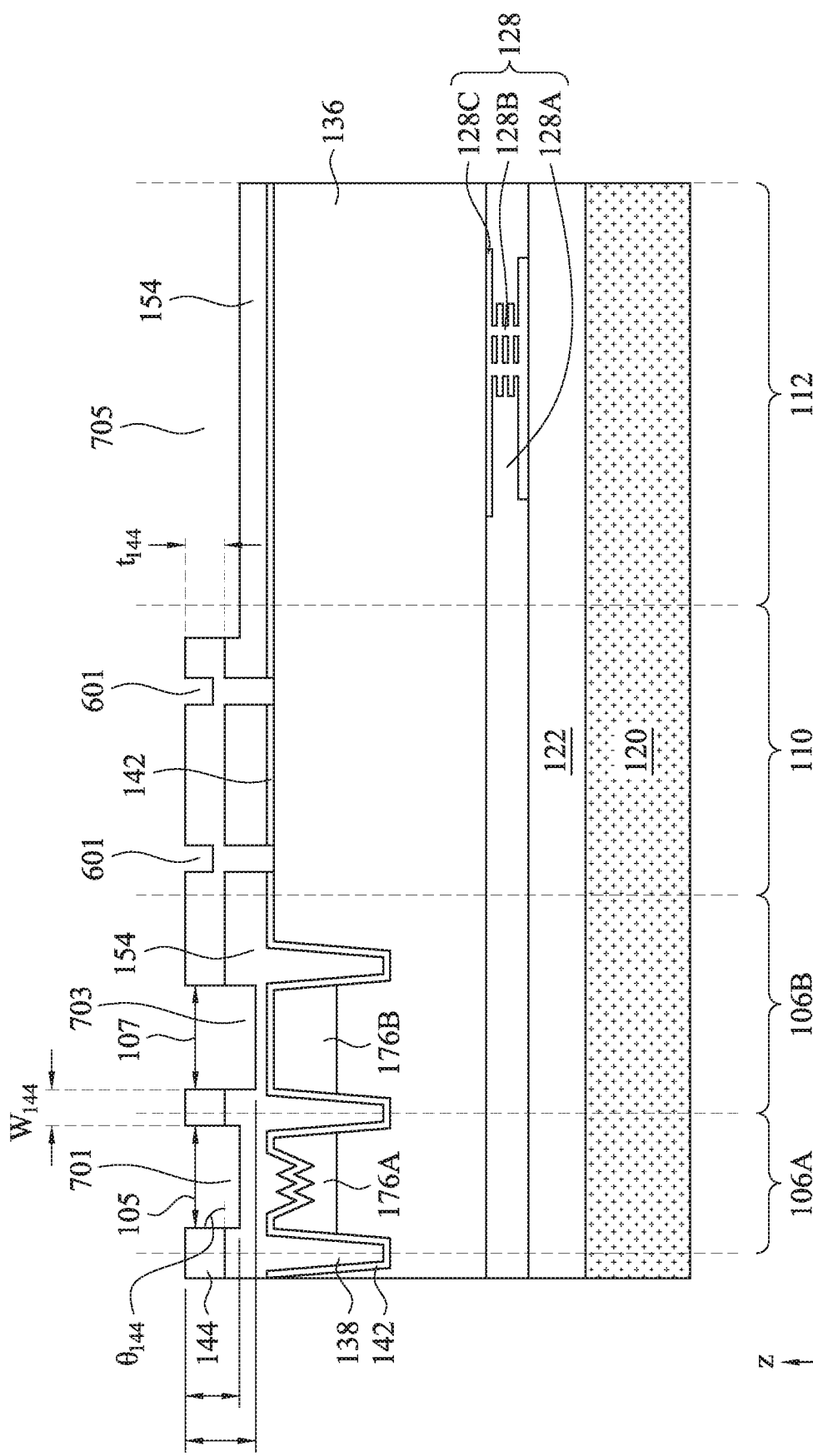
Figure 8:
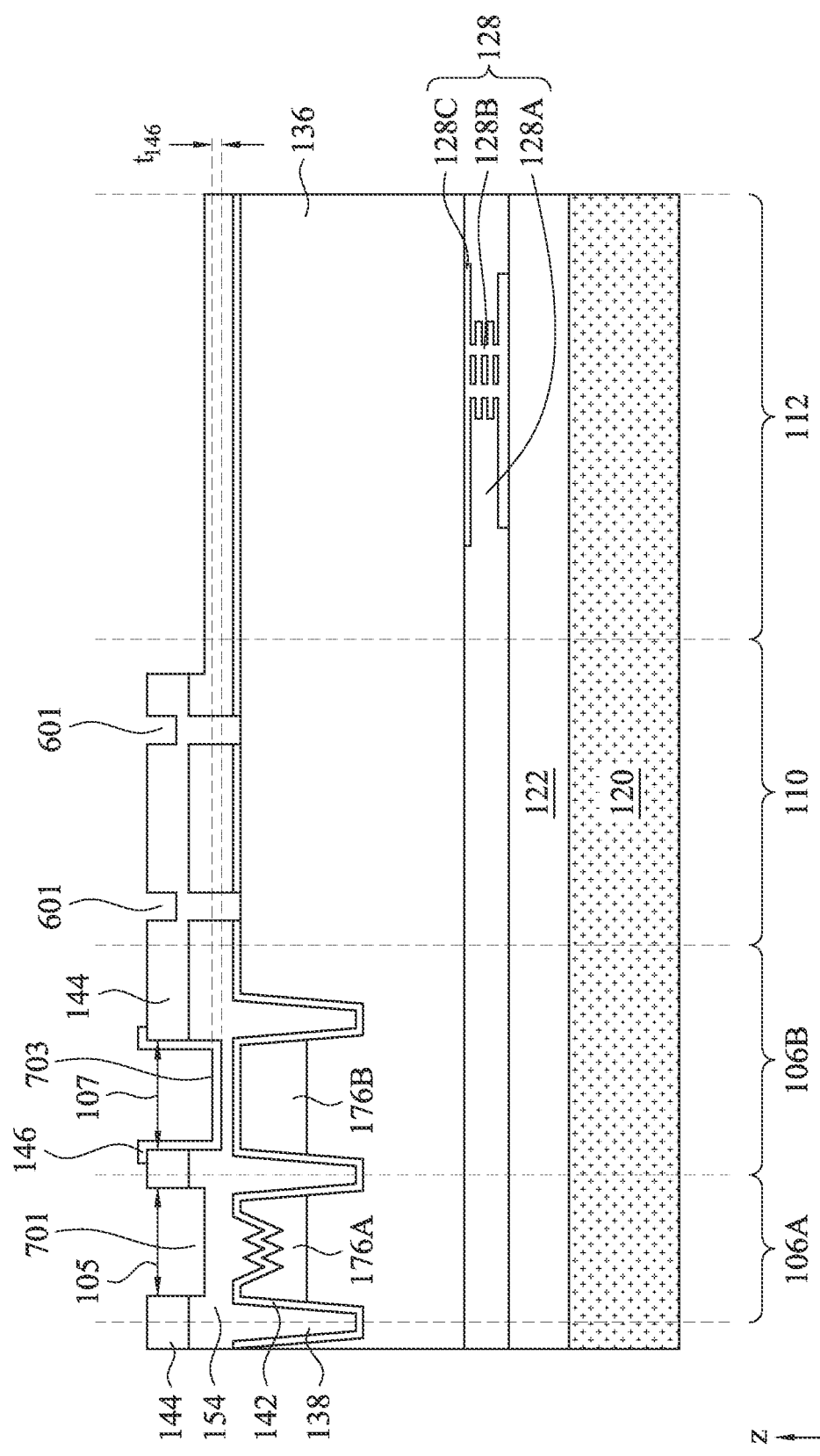

In some embodiments, the process of forming grid structure 144 of FIG. 7 can further include forming openings 705 through metal layer 644 at the pad region 112. In some embodiments, at least one of openings 701, 703, and 705 can be formed protruding portions of dielectric layer 154.

Subsequently, referring to FIG. 8, in operation 220, blocking layer 146 can be filled in openings 703 using a deposition process, a lithography process, and an etching process. For example, the filling process for forming block layer 146 can include (i) depositing a metal layer in openings 701, 703, and 705 using a suitable deposition process, such as a CVD process, a PVD process, a plating process, and an e-beam evaporation process, (ii) defining a mask layer (not shown in FIG. 8) to cover openings 703 with the lithography process, and (iii) etching portions of the deposited metal layer through the mask layer. As a result, blocking layer 146 can be formed with a thickness $T_{146}$ over opening 703's bottom surface to vertically overlap with radiation sensing region 176B. Thickness $T_{146}$ can be any suitable thickness less than grid structure 144's thickness $T_{144}$, such as from about 5 nm to about 100 nm, that allows portions of the incident light to reach the underlying radiation sensing region 176B. In some embodiments, blocking layer 146 can be further formed over opening 703's sidewalls. In some embodiments, blocking layer 146 can protrude into portions of dielectric layer 154 that is vertically (e.g., in the z-direction) above radiation sensing region 176B's top surface $176B_T$. Based on the disclosure herein, other forming methods and thicknesses for blocking layer 146 are within the scope and spirit of this disclosure.

In some embodiments, instead of forming blocking metal layer 146, operation 220 can form grid structure 144 that can laterally (e.g., in the x-y plane) extend under apertures 107 as the blocking layer to cover radiation sensing region 176B, as described with reference to FIGS. 6, 9, and 10.

Figure 9:
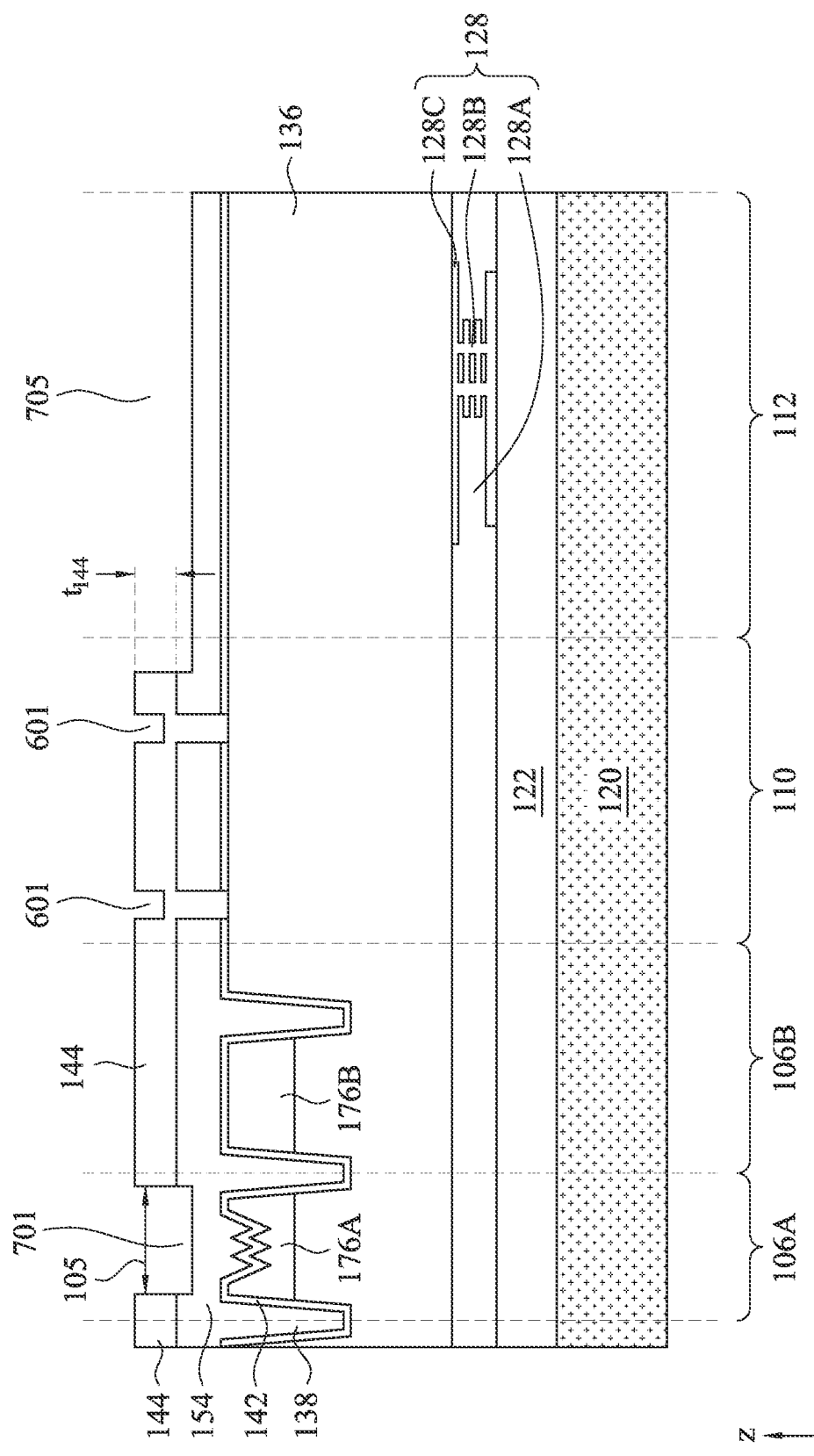

For example, referring to FIGS. 6 and 9, operation 220 can begin with forming grid structures 144 with openings 701 and 705 over semiconductor layer 136's back surface $136_R$. The process of forming grid structure 144 of FIG. 9 can include (i) depositing metal layer 644 (shown in FIG. 6) with thickness $t_{144}$ over the structure of FIG. 5 using a suitable deposition process, such as a CVD process, a PVD process, a plating process, and an e-beam evaporation process, (ii) patterning a mask layer (not shown in FIG. 9) over metal layer 644 to expose pixel 106A and cover pixels 106B using a lithography process, and (iii) etching metal layer 644 through the mask layer to form grid structure 144 of FIG. 9. Accordingly, as shown in FIG. 9, the resulting grid structure 144 can have openings 701 formed through metal layer 644 at pixels 106A to define apertures 105. The resulting grid structure 144 can also include metal segments over sensing region 176B's top surface $176B_T$ to cover pixels 106B. In some embodiments, the mask layer can further expose pad regions 112, thus forming openings 705 for grid structure 144 at pad regions 112 after etching metal layer 644.

Figure 10:
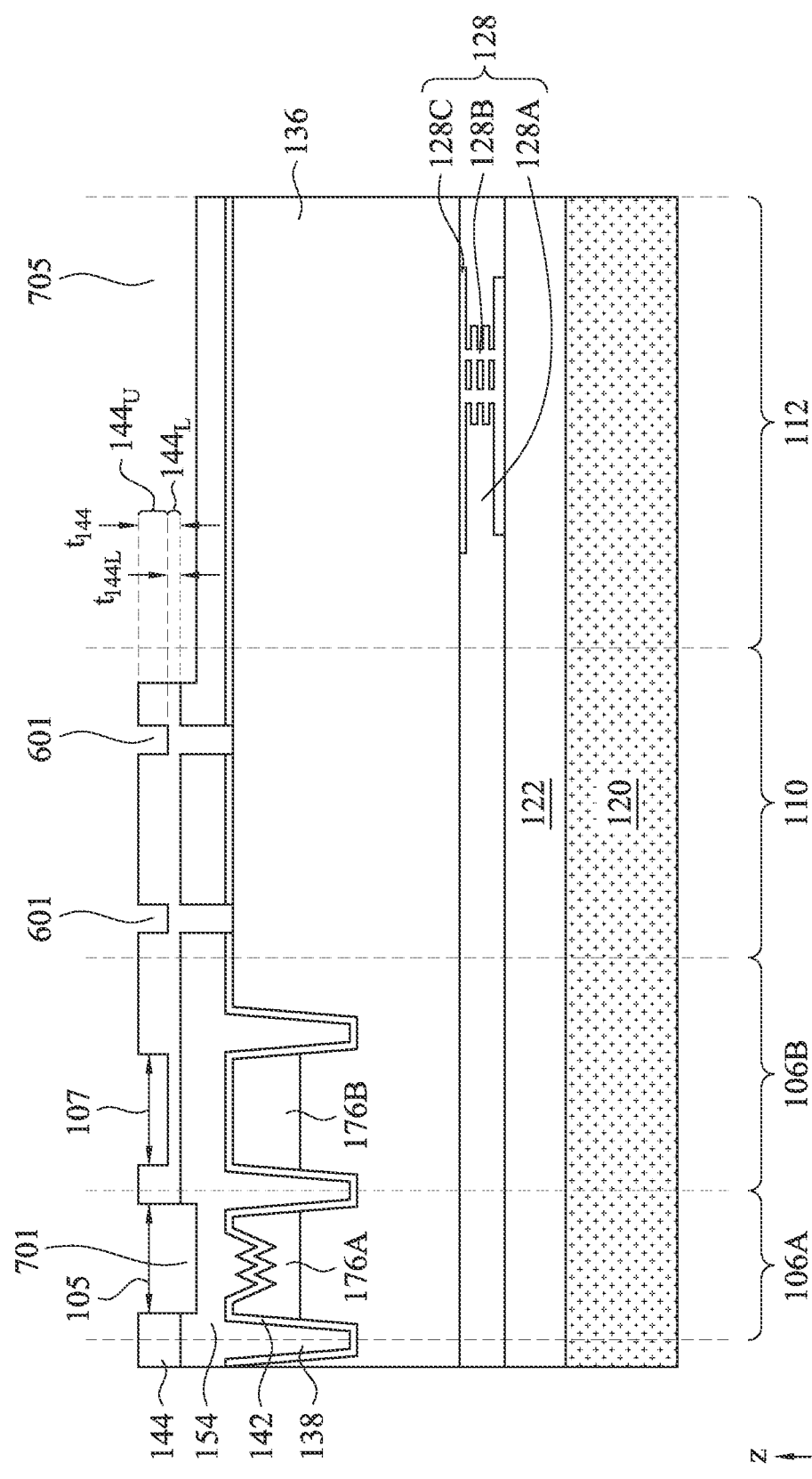
Figure 11:
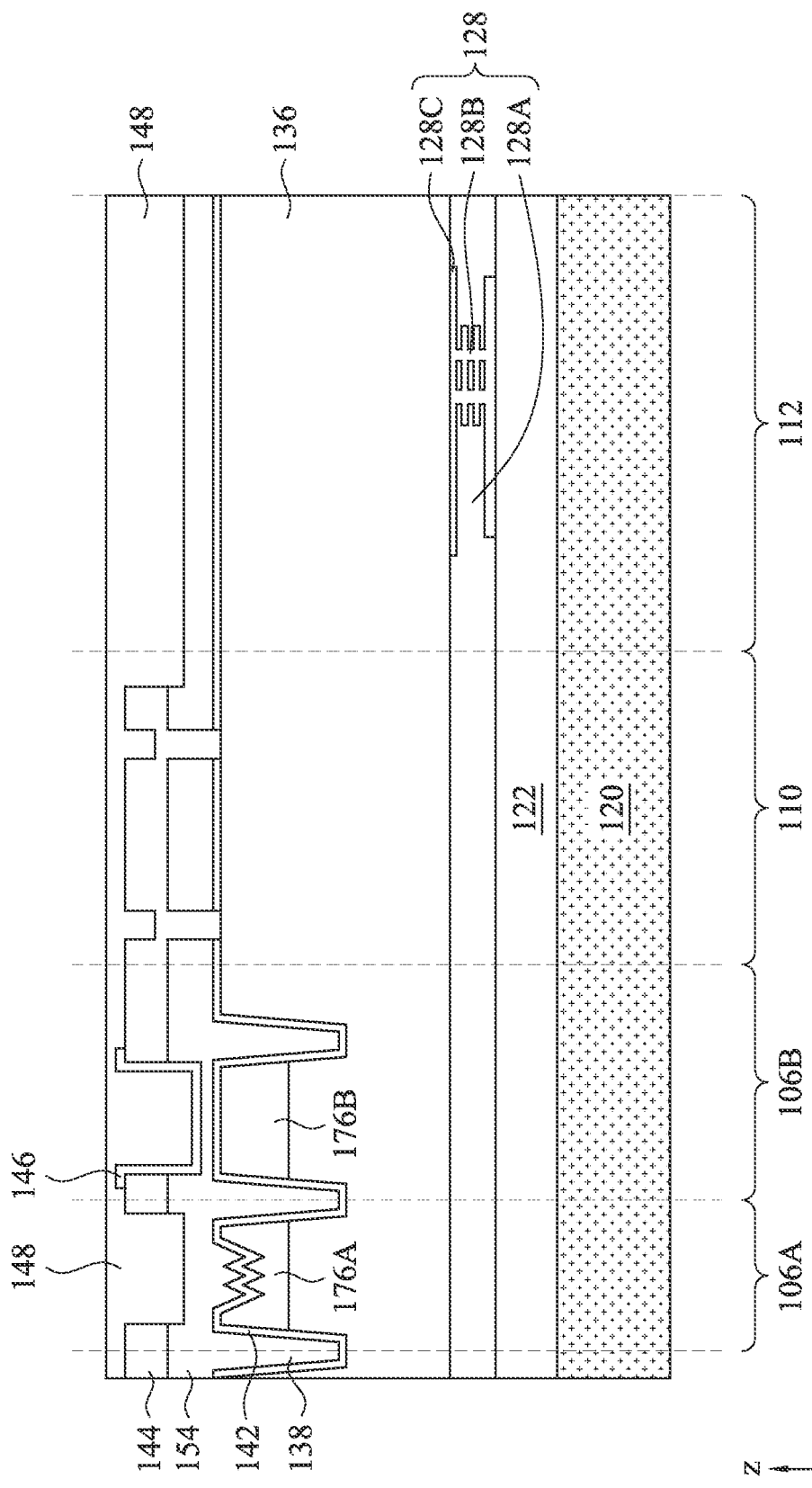
Figure 12:
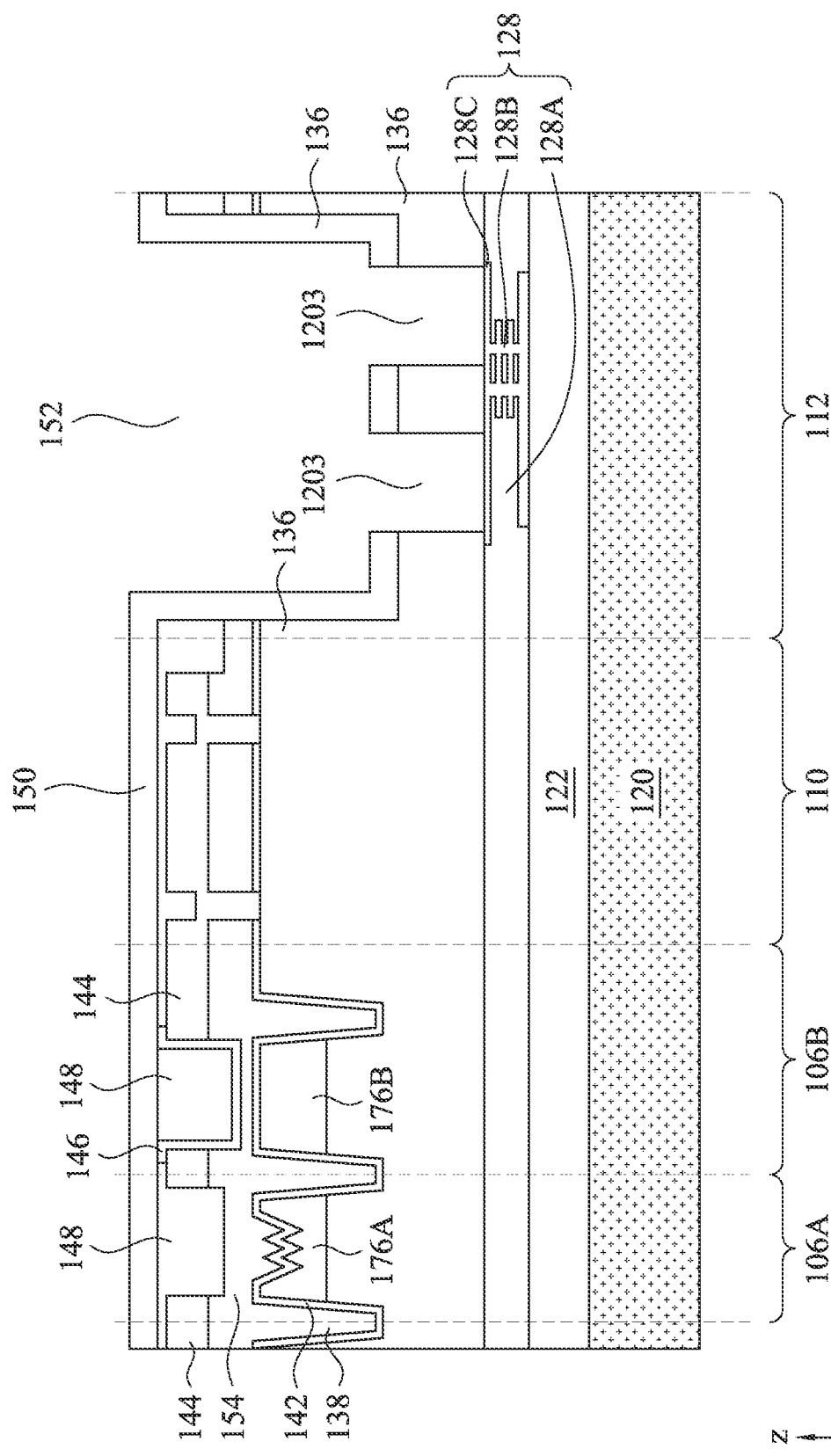

Referring to FIG. 10, operation 220 can further include defining aperture 107 by forming a recess structure in portions of grid structure 144 that are above sensing region 176B's top surface $176B_T$. The resulting aperture 107 in FIG. 10 can be referred to as groove structure 107. The process of forming groove structure 107 can include (i) forming a mask layer (not shown in FIG. 10) over the structure of FIG. 9 to expose grid structure 144 at pixels 106B using a lithography process, and (ii) etching grid structure 144's upper portion $144_U$ through the mask layer using an etching process, and etching stop at grid structure 144's lower portion $144_L$. Grid structure 144's lower portion $144_L$ can have a thickness $t_{144L}$ formed above portions of dielectric layer 154 that is vertically (e.g., in the z-direction) above radiation sensing region 176B's top surface $176B_T$. Accordingly, groove structure 107 (e.g., aperture 107) can have a bottom surface made of grid structure 144's lower portion $144_L$ vertically overlapping with radiation sensing region 176B. Thickness $T_{144L}$ can be any suitable thickness greater than zero and less than grid structure 144's thickness $T_{144}$, such as from about 5 nm to about 100 nm, that allows portions of the incident light to reach the underlying radiation sensing region 176B. In some embodiments, groove structure 107 (e.g., aperture 107) can have a rectangular-shaped cross-sectional profile or a semi-oval shaped cross-sectional profile. Based on the disclosure herein, other thicknesses for groove structure 107 are within the scope and spirit of this disclosure.

Referring to FIG. 2, in operation 225, a pad structure is formed to cover the back side of the semiconductor layer. For example, as shown in FIG. 1C, contact pad 132 can be formed over semiconductor layer 136's back surface $136_R$, as described with reference to FIGS. 11 and 12, according to some embodiments. The process of forming contact pad 132 can include forming passivation layer 148 (shown in FIG. 11) over the structure of FIG. 8 using a suitable deposition process, such as a CVD process and a PVD process, and a polishing process (e.g., a CMP process). For example, passivation layer 148 can have a substantially planar top surface formed above grid structure 144, dielectric layer 154, notch structures 601, and openings 105 and 107. In some embodiments, passivation layer 148 can be deposited in opening 701 of FIG. 8 that can protrude in dielectric layer 154. Therefore, passivation layer 148 can have a bottom surface vertically below grid structure 144 in pixels 106A. In some embodiments, passivation layer 148 can be deposited in opening 703 of FIG. 8 and over blocking layer 146 of FIG. 8. Therefore, passivation layer 148 can have a bottom surface vertically above blocking layer 146 in pixels 106B. The process of forming contact pad 132 can further include (i) forming opening 152 (shown in FIG. 12) through passivation layer 148 at pad region 112 using an etching process, such as a dry etching process using etching gases of $Cl_2$ and $CF_4$, (ii) forming passivation layer 150 over passivation layer 148 and over exposed surfaces of opening 152 using a coating process or a suitable depositing process, such as a CVD process and a PVD process, and (iii) forming openings 1203 (shown in FIG. 12) through passivation layer 150 and semiconductor layer 136 to expose interconnect structure 128 and filling one or more conductive materials in openings 1203 as contact pad 132 to connect the exposed interconnect structure 128. In some embodiments, a wire connector (not shown in FIG. 11) can be formed over contact pad 132 to electrically connect to pixel array 102 and/or the IC layer in semiconductor layer 136. In some embodiments, the previously described process of forming contact pad 132 can start from the structure of FIG. 9 (e.g., forming passivation layer 148 over the structure of FIG. 9, etc.) to result in contact pad 132 shown in FIG. 1B. Such embodiment is not shown in FIGS. 11 and 12 for simplicity. In some embodiments, passivation layer 148 can be deposited in aperture 105 of FIG. 9 and groove structure 107 of FIG. 9, such that passivation layer 148 can have a bottom surface vertically below grid structure 144 in pixels 106A and another bottom surface vertically above grid structure 144 in pixels 106B.

Various embodiments in accordance with this disclosure describe the formation of an image sensor device (e.g., a BSI image sensor device) using a blocking layer to achieve high quantum efficiency and high dynamic range. The BSI image senor can include first pixels configured to have a high quantum efficiency and second pixels configured to have high saturation level. In some embodiments, each of the first pixels can have a groove structure to improve collection of incident light. In some embodiments, each of the second pixels can include a blocking layer to attenuate the incident light to avoid the saturation of the photo-generated carrier in the second pixels. In some embodiments, the blocking layer can be a metal layer that can attenuate a portion of the incident light and transmit through another portion of the incident light. A benefit of the image sensor devices, among others, is to provide both high quantum efficiency and high dynamic range for imaging environment objects with a wide range of irradiation (e.g., illumination) intensity.

In some embodiments, a method can include forming an interconnect structure over a first surface of a semiconductor layer, forming a radiation sensing region into a second surface of the semiconductor layer. The second surface can be opposite to the first surface. The method can further include depositing a metal layer with a groove structure over the radiation sensing region, and depositing a passivation layer over the groove structure. The metal layer can be between the passivation layer and the radiation sensing region.

In some embodiments, a method can include forming an interconnect structure over a first surface of the semiconductor layer, forming first and second radiation sensing regions into a second surface of the semiconductor layer. The second surface can be opposite to the first surface. The method can further include forming a metal stack over the second surface of the semiconductor layer to mask the second radiation sensing region. The process of forming the metal stack can include forming an opening through the metal stack and over the first radiation sensing region. The method can further include forming a passivation layer over the second surface of the semiconductor layer. The metal stack can be between the passivation layer and the second radiation sensing region.

In some embodiments, an image sensor device can include a semiconductor layer. The semiconductor layer can include a first surface and a second surface. The image sensor device can further include an interconnect structure formed over the first surface of the semiconductor layer, first and second radiation sensing regions formed in the second surface of the semiconductor layer, a metal stack formed over the second radiation sensing region, and a passivation layer formed through the metal stack and over a top surface of the first radiation sensing region. The metal stack can be between the passivation layer and an other top surface of the second radiation sensing region.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
   forming an interconnect structure over a first surface of a semiconductor layer;
   forming a radiation sensing region into a second surface of the semiconductor layer, wherein the second surface is opposite to the first surface;
   depositing a metal layer with a groove structure over the radiation sensing region;
   forming a grid structure surrounding the groove structure and having a bottom surface above a bottom surface of the groove structure; and
   depositing a passivation layer over the groove structure, wherein the metal layer is between the passivation layer and the radiation sensing region, and wherein the passivation layer is directly above the metal layer.

2. The method of claim 1, wherein forming the interconnect structure comprises:
   depositing a dielectric layer over the first surface of the semiconductor layer;
   depositing a vertical conductive structure in the dielectric layer to connect the semiconductor layer; and
   depositing a horizontal conductive structure in the dielectric layer to connect the vertical conductive structure.

3. The method of claim 1, wherein forming the radiation sensing region comprises performing a doping process on the semiconductor layer from the second surface.

4. The method of claim 1, wherein depositing the metal layer comprises:
   depositing an other metal layer over the second surface of the semiconductor layer;
   etching the other metal layer to form an opening through the other metal layer, wherein the opening is laterally overlapped with a top surface of the radiation sensing region; and
   depositing the metal layer in the opening to mask the top surface of the radiation sensing region.

5. The method of claim 1, wherein depositing the metal layer comprises:
   depositing an other metal layer over the second surface of the semiconductor layer; and
   removing an upper portion of the metal layer to expose a lower portion of the metal layer that masks a top surface of the radiation sensing region.

6. The method of claim 1, wherein depositing the metal layer comprises etching a portion of the metal layer to form the groove structure with a bottom metallic surface that has an area between about 70% and about 95% of a top surface of the radiation sensing region.

7. The method of claim 1, wherein depositing the passivation layer comprises depositing a dielectric layer with a bottom surface vertically above the metal layer.

8. The method of claim 1, further comprising depositing a dielectric layer vertically between the metal layer and a top surface of the radiation sensing region.

9. A method, comprising
   forming an interconnect structure over a first surface of a semiconductor layer;
   forming first and second radiation sensing regions into a second surface of the semiconductor layer, wherein the second surface is opposite to the first surface;
   forming a metal stack over the second surface of the semiconductor layer to mask the second radiation sensing region, wherein forming the metal stack comprises forming an opening through the metal stack and over the first radiation sensing region;
   forming a passivation layer over the second surface of the semiconductor layer, wherein a separation between the metal stack and the second radiation sensing region is less than a separation between the passivation layer and the first radiation sensing region; and
   forming an opening through the passivation layer to expose the interconnect structure.

10. The method of claim 9, wherein forming the interconnect structure comprises:
    depositing a dielectric layer over the first surface of the semiconductor layer;
    forming a vertical conductive structure in the dielectric layer to connect the semiconductor layer; and
    forming a horizontal conductive structure in the dielectric layer to connect the vertical conductive structure.

11. The method of claim 9, wherein forming the first and second radiation sensing regions comprises performing a doping process on the semiconductor layer from the second surface.

12. The method of claim 9, wherein forming the metal stack comprises:
    depositing a metal layer over the second surface of the semiconductor layer; and
    thinning a portion of the metal layer that is laterally overlapped with a top surface of the second radiation region.

13. The method of claim 9, wherein forming the metal stack comprises:
    depositing a metal layer over the second surface of the semiconductor layer;

forming an other opening through the metal layer and laterally overlapped with a top surface of the second radiation sensing region; and depositing an other metal layer in the other opening to mask a top surface of the second radiation sensing region.

14. The method of claim 9, wherein forming the opening comprises removing a portion of the metal stack over the first radiation sensing region, while masking an other portion of the metal stack over the second radiation sensing region.

15. The method of claim 9, wherein forming the passivation layer comprises depositing a dielectric layer in the opening and over a portion of the metal stack that is over a top surface of the second radiation sensing region.

16. A method, comprising:
forming an interconnect structure over a first surface of a semiconductor layer;

forming a first radiation sensing region and a second radiation sensing region on a second surface of the semiconductor layer, wherein the second surface is opposite to the first surface of the semiconductor layer;

etching a top surface of the first radiation sensing region to form groove structures;

forming a metal stack over the second radiation sensing region; and forming a passivation layer over the groove structures and the metal stack, wherein a first separation between the passivation layer and the first radiation sensing region is greater than a second separation between the passivation layer and the second radiation sensing region.

17. The method of claim 16, wherein etching the top surface of the first radiation sensing region comprises forming a triangular-shaped cross-sectional profile of the groove structures in the first radiation sensing region.

18. The method of claim 16, wherein forming the metal stack comprises forming a portion of the metal stack over the top surface of the second radiation sensing region having a thickness less than a thickness of a different portion of the metal stack that is vertically above and laterally displaced from the top surface of the second radiation sensing region.

19. The method of claim 16, wherein forming the metal stack comprises forming a first metal layer and a second metal layer, wherein the first metal layer is formed over the top surface of the second radiation sensing region, and wherein the second metal layer is formed above and laterally displaced from the top surface of the second radiation sensing region.

20. The method of claim 16, further comprising forming a trench structure between the first and second radiation sensing regions.

* * * * *